United States Patent [19]

Ouyang et al.

[11] Patent Number: 4,692,717
[45] Date of Patent: Sep. 8, 1987

[54] VOLTAGE CONTROLLED OSCILLATOR WITH HIGH SPEED CURRENT SWITCHING

[75] Inventors: Kenneth W. Ouyang, Huntington Beach; Melvin Marmet, Placentia, both of Calif.

[73] Assignee: Western Digital Corporation, Irvine, Calif.

[21] Appl. No.: 940,212

[22] Filed: Dec. 8, 1986

Related U.S. Application Data

[63] Continuation of Ser. No. 839,504, Mar. 14, 1986, abandoned.

[51] Int. Cl.$^4$ .................... H03K 3/023; H03K 3/354
[52] U.S. Cl. .................................. 331/111; 331/177 R
[58] Field of Search .............. 331/34, 111, 143, 177 R

[56] References Cited

U.S. PATENT DOCUMENTS

| | | | |
|---|---|---|---|
| 3,886,485 | 5/1975 | Takashashi | 331/111 |
| 3,904,988 | 9/1975 | Hsiao | 331/111 |
| 4,048,590 | 9/1977 | Dobberpuhl | 331/116 R |
| 4,083,020 | 4/1978 | Goldberg | 331/113 R |
| 4,091,335 | 5/1978 | Giolma et al. | 331/1 A |
| 4,203,075 | 5/1980 | Wessler | 331/1 A |
| 4,263,567 | 4/1981 | Astle | 331/111 |
| 4,321,561 | 3/1982 | Payne et al. | 331/111 |
| 4,470,024 | 9/1984 | Leuenberger | 331/108 D |
| 4,494,080 | 1/1985 | Call | 331/8 |

Primary Examiner—Siegfried H. Grimm
Attorney, Agent, or Firm—Spensley Horn Jubas & Lubitz

[57] ABSTRACT

A CMOS voltage controlled oscillator includes a reference capacitor which is charged and discharged by current source and sink output transistors. The output transistors are connected to control transistors in a current mirror fashion with current through the control transistors being maintained at a level proportional to the value of a control input voltage. The control transistors are selectively connected to the output transistors in a current mirror configuration to provide either current source or sink operation. Transmission gates are connected between the gates of the output and control transistors and selectively closed to render the proper output transistor conductive to achieve source or sink operation. MOS capacitors are connected to the control transistors to facilitate rapid switching of the output transistors to enable high frequency operation of the voltage controlled oscillator.

14 Claims, 8 Drawing Figures

REFERENCE VOLTAGE

TR40 CURRENT

I38 CURRENT $C_{EXT}$

OP AMP -16-

VCO $\overline{VCO}$

VOLTAGE CONTROLLED OSCILLATOR WITH HIGH SPEED CURRENT SWITCHING

This is a continuation of copending application Ser. No. 839,504 filed on Mar. 14, 1986 and now abandoned.

BACKGROUND OF THE INVENTION

1. Field of the Invention

The present invention relates to voltage controlled oscillators (VCO's) and more particularly to voltage controlled oscillators incorporating complementary metal oxide silicon field effect transistor (CMOS) circuitry. Voltage controlled oscillators are widely used in phase-locked loop (PLL) circuits.

A voltage controlled oscillator operates to provide an output frequency which is linearly related to a control input voltage. Typically, this is achieved by providing a capacitor which is charged and discharged at a rate proportional to the control voltage. A comparator is provided to switch between charging and discharging when the voltage on the capacitor goes above or below first and second reference voltages, respectively.

2. Description of the Prior Art

Voltage controlled oscillators including current source and current sinks for charging and discharging a capacitor are shown in U.S. Pat. Nos. 3,886,408 to Takahashi, 3,904,988 to Hsiao, 4,236,567 to Astle and 4,321,561 to Payne et al. In both the Payne and Hsiao patents, current switching is provided by switching transistors which are located in the output current path. Although generally acceptable, such circuits are limited in that the inclusion of switching in the output current path introduces parasitic resistance and capacitance, thus slowing the switching time. In order for the VCO to operate properly, it is desirable to have the current sink or source switched as rapidly as possible so that a uniform charging rate is achieved for the capacitor. It is not possible to achieve such rapid switching with prior art circuits which include switching in the output current path.

SUMMARY OF THE INVENTION

The present invention is directed to a voltage controlled oscillator having a high switching speed. The voltage controlled oscillator of the invention is capable of running at 10 MHz or above and is thus suitable for use in the phase-locked loop of a hard disk data separator. The circuit includes a reference capacitor which is charged and discharged by means of output transistors operating as a current source or current sink. The output transistors are connected to control transistors in a current mirror configuration by means of transmission gates which are switched to control operation as a current source or current sink. FET capacitors are connected to the gates of the current mirror transistors so that the output transistors can be rapidly switched. This assures a uniform charging and discharging rate for the capacitor which in turn assures precise oscillator operation.

BRIEF DESCRIPTION OF THE DRAWINGS

The invention will be described with reference to the accompanying drawings, wherein.

DESCRIPTION OF THE PREFERRED EMBODIMENT

The following description is of the best presently contemplated mode of carrying out the invention. This description is made for the purpose of illustrating the general principles of the invention and is not to be taken in a limiting sense. The scope of the invention is best determined by reference to the appended claims.

Figure 1:
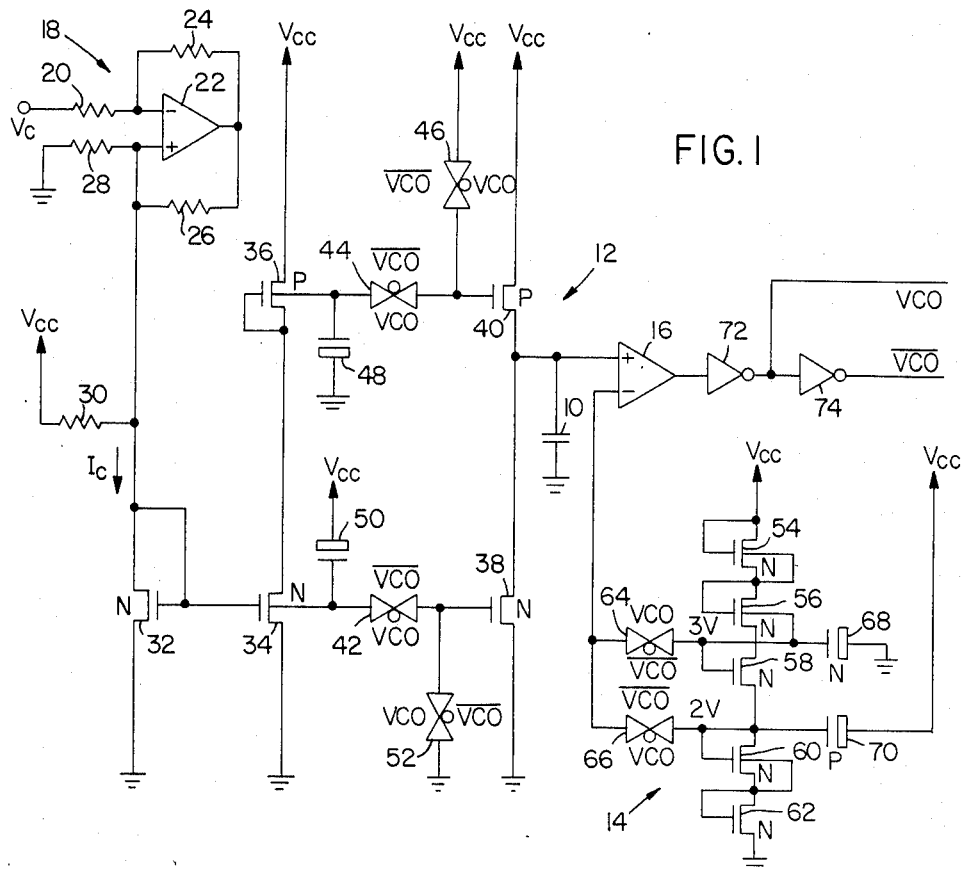
FIG. 1 is a schematic diagram of the voltage controlled oscillator of the present invention.

Referring to FIG. 1, the present invention is directed to an oscillator which provides a periodic output signal VCO whose frequency is controlled by the value of an input control voltage Vc. A reference capacitor 10 is charge and discharged between two reference votages under control of charging circuitry 12. The reference voltages are provided by means of a voltage divider network 14, the output of which is provided to a comparator 16 which compares the reference voltage to the voltage across the reference capacitor 10.

The charging and discharging rate of the circuit is controlled by means of the control input voltage Vc. This input voltage is converted to a control current by means of a voltage-to-current converter 18. The voltage-to-current converter includes an input resistor 20, an operational amplifier 22, a feedback resistor 24, an output resistor 26 and a bias resistor 28. The operating point of the oscillator is determined by means of an external resistor 30 which is chosen to provide a desired control current level Ic corresponding to a given input voltage.

The control current Ic supplies and drives a reference N-type FET transistor 32. The value of the reference current flowing through the transistor 32 is thus dependent on the value of the control input voltage. The transistor 32 is connected in a current mirror configuration to an N-type transistor 34. Due to the common connection of the gates and sources of the transistors, the current through the transistor 34 will mirror the current through the transistor 32. The current flowing through the transistor 34 will also flow through a P-type transistor 36 whose drain and gate are connected to the drain of the transistor 34 and whose source is connected to a power supply Vcc. Thus, a current will flow through the transistors 34 and 36 and will have a value which is determined by the value of the reference current flowing through the transistor 32.

The gates of the transistors 34 and 36 are coupled to the gates of output transistors 38 and 40, respectively, via transmission gates 42 and 44. The source of the transistor 38 is connected to ground and the source of the transistor 40 is connected to the power supply, whereas the drains of the transistors are interconnected and connected to one terminal of the reference capacitor 10. The transistor 38 is thus coupled to the transistor 34 in a current mirror configuration, and the transistor 40 is coupled to the transistor 36 in a current mirror configuration.

The transistors 38 and 40 are alternately switched on and off to control the charging and discharging of the reference capacitor 10. In order to charge the capacitor 10, the transmission gate 44 is closed to couple the transistor 36 to the transistor 40. This will turn on the transistor 40 and cause current to flow through it and charge the reference capacitor 10. When charging is complete, the transmission gate 44 is opened and a transmission gate 46 is closed to turn off the transistor 40.

In order to ensure precise and rapid switching of the transistor 40, an FET capacitor 48 is connected to the gate of the transistor 36. This capacitor stores a charge and provides sufficient instantaneous current to quickly switch the transistor 40 to the conductive state. In the present embodiment of the invention, the capacitor 48 has a value of approximately 30 picofarads and is biased at 3.5 volts gate-to-source voltage. The transistor 40 has a size approximately ten times that of the transistor 36, and the current through it will be proportional to the current through the transistor 36 and in direct relation to the relative sizes of the transistors.

Thus, a current proportional to the control input voltage will flow through the transistor 36 and the transistor 40 will rapidly switch to a conductive state upon the closing of the transmission gate 44. Current through the transistor 40 will thus change in a step fashion to a level which is proportional to the control input voltage. This current level will determine the charging rate of the capacitor 10.

Whereas the transistor 40 operates as a current source, the transistor 38 operates as a current sink to discharge the reference capacitor 10. It is rendered conductive by closing the transmission gate 42 to interconnect the gate of the transistor 38 with that of the transistor 34. The size of the transistor 38 is approximately ten times the size of the transistor 34, and the current through it will be proportional to the current through the transistor 34. Again, an MOS capacitor 50 is provided so that sufficient instantaneous current is available to rapidly switch the transistor 38 to the conductive state. One terminal of the capacitor 50 is connected to the supply voltage to bias the capacitor 50 to achieve proper MOS capacitor operation. The value of the capacitor 50 is the same as that of the capacitor 48, i.e., approximately 30 picofarads in the present embodiment of the invention. An additional transmission gate 52 is provided to connect the gate of the transistor 38 to ground to switch off the transistor.

High and low reference voltages (three volts and two volts in the present embodiment of the invention) are provided by means of a voltage divider including five interconnected transistors 54, 56, 58, 60 and 62. One of the two reference voltages is provided to the inverting input of the comparator 16 by appropriately controlling two transmission gates 64 and 66. The transmission gates are alternately switched, and MOS capacitors 68 and 70 are provided to facilitate rapid changing of the value of the reference voltage applied to the comparator 16.

Figure 2A:
FIG. 2A-2G are timing diagrams associated with the present invention.

The operation of the voltage controlled oscillator of FIG. 1 will be explained with reference to the timing diagrams of FIG. 2. Initially, the transmission gate 64 is closed and the transmission gate 66 is opened and the reference voltage applied to the inverting input of the comparator 16 is therefore three volts as indicated in FIG. 2A. The transistor 40 is turned on and the current through it is a positive value whose magnitude is determined by the value of the input control voltage. The capacitor 10 will thus charge up at a constant rate determined by the magnitude of the current through the transistor 40, as indicated in FIG. 2D.

Figure 2B:
Figure 2C:
Figure 2D:
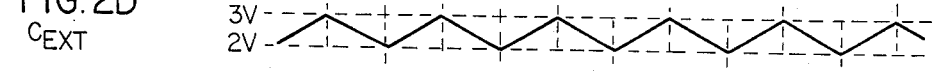
Figure 2E:
Figure 2F:
Figure 2G:
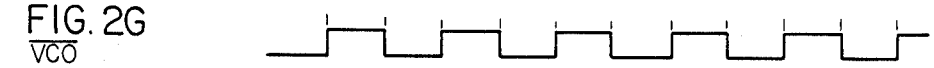

When the voltage on the capcitor 10 reaches three volts, the output of the comparator 16 will change states (FIG. 2E). This output is applied to a first inverter 72 to provide the VCO output. The complement of this output is provided by an inverter 74. These outputs are provided to the transmission gates 42, 44, 46, 52, 64 and 66. The switching of the output causes the transmission gate 44 to open and the transmission gate 46 to close, thereby switching off the transistor 40. Simultaneously, the transmission gate 42 will close and transmission gate 52 open to render the transistor 38 conductive. The capacitor 10 thus begins discharging through the transistor 38. In addition, the transmission gate 66 is closed and the transmission gate 64 opened to change the reference voltage applied to the comparator from the three volt level to the two volt level as indicated in FIG. 2A. The step change in the current through the transistor 38 as indicated in FIG. 2C causes the capacitor to discharge at a constant rate as shown in FIG. 2D. This discharging continues until the two volt level is reached, at which the output of the comparator 16 will again change as shown in FIG. 2E, thus changing the states of the output signals VCO and $\overline{VCO}$ as shown in FIG. 2F and 2G.

The provision of the capacitors 48 and 50 enables the step change and current through the transistors 40 and 38 as shown in FIG. 2b and 2c to be achieved. In addition, the capacitors 68 and 70 enable a step change in the reference voltage between the three volt and two volt levels to be achieved. As a result, charging and discharging rates can be very precisely controlled. Accurate oscillator operation can be achieved at extremely high frequencies necessary for various applications such as use in phase-locked loop data separators in disk drives. The reference capacitors will charge and discharge between two reference voltages, with the rate of charging being precisely controlled due to the rapid switching of the transistors 38 and 40.

What is claimed is:

1. A voltage controlled oscillator, comprising:
   a reference capacitor which is periodically charged and discharged;
   comparison means for comparing the voltage on the reference capacitor to a first reference voltage when the capacitor is charging and a second reference voltage when the capacitor is discharging, wherein the output of the comparison means is the output of the oscillator and switches from a first level to a second level when the voltage on the capacitor equals the first reference voltage and from the second level to the first level when the voltage on the capacitor equals the second reference voltage; and
   pump means for charging and discharging the reference capacitor at a rate determined by the value of an input voltage, said pump means including a first MOS transistor for discharging the reference capacitor and a second complementary MOS transistor for charging the reference capacitor, third and fourth complementary MOS transistors having a current flowing through them corresponding to the value of the input voltage, switching means for alternately connecting together the gates of the first and third transistors to turn on the first transistor and the gates of the second and fourth transistors to turn on the second transistor, and first and second capacitors connected to the gates of the third and fourth transistors, respectively, said capacitors storing a charge to facilitate rapid turn-on of the first and second transistor.

2. A voltage controlled oscillator as in claim 1 wherein the pump means includes input means for receiving the input voltage and providing a corresponding control current, said control current controlling the amount of current through the third and fourth transistors.

3. A voltage controlled oscillator as in claim 2 wherein the input means includes:
   a voltage-to-current converter which receives the input voltage and converts it to an output current;
   a bias resistor connected between a power supply and the output of the converter; and
   a MOS control transistor having a first electrode and gate electrode connected to the output of the converter, wherein the current through the control transistor is equal to the sum of the current through the bias resistor and the output current, and wherein the gate electrode of the control transistor is connected to the gate electrode of the third transistor to provide a current mirror configuration whereby the current through the third and fourth transistors corresponds to the current through the control transistor.

4. A voltage controlled oscillator as in claim 1 wherein the switching means includes a first transmission gate connected between the gates of the first and third transistors and a second transmission gate connected between the gates of the second and fourth transistors, wherein the transmision gates are alternately closed and opened to alternately turn the first and second transistors on and off.

5. A voltage controlled oscillator as in claim 4 including a third transmission gate connected between the gate of the first transistor and ground and being closed when the first transmission gate is opened, and a fourth transmission gate connected between the gate of the second transistor and a power supply, said fourth transmission gate being closed when the second transmission gate is opened, said third and fourth transmission gates facilitating rapid turn-off of the first and second transistors.

6. A voltage controlled oscillator as in claim 1 wherein the first and second capacitors are MOS capacitors.

7. A voltage controlled oscillator as in claim 6 wherein the first capacitor has a terminal connected to the gate of the third transistor and a terminal conected to a power supply and wherein the second transistor has a terminal connected to the gate of the fourth transistor and a terminal conected to ground.

8. A voltage controlled oscillator as in claim 1 wherein the comparison means includes:
   voltage switching means for connecting the first or second reference voltages to a reference terminal; and
   a comparator, wherein the reference capacitor is connected to one input thereof and the reference terminal is connected to the other input thereof, wherein the comparator output changes states at a frequency determined by the input voltage and wherein the switching means and voltage switching means are switched in response to the changing of the output of the comparator.

9. A voltage controlled oscillator as in claim 8 including a plurality of MOS transistors connected in a series diode configuration between a power supply and ground, wherein the first reference voltage is obtained at an output terminal of one of the transistors and the second reference voltage is obtained at an output terminal of another transistor.

10. A voltage controlled oscillator as in claim 9 including a third capacitor connected to the output terminal of said one transistor and a fourth capacitor connected to the output terminal of said another transistor, said third and fourth capacitors facilitating rapid switching at the reference terminal between the first reference voltage and the second reference voltage.

11. A voltage controlled oscillator comprising:
   a power supply;
   input means for providing a control current corresponding to an input voltage;
   fast switching current pump means for providing a current sink or source in which the value of current at an output terminal is a function of the control current, said pump means including:
      a first MOS transistor of first conductivity type having a first electrode connected to the power supply, a second electrode connected to the output terminal, and a control electrode;
      a second MOS transistor of second conductivity type having a first electrode connected to ground, a second electrode connected to the output terminal and a control electrode;
      a third MOS transistor of first conductivity type having a first electrode connected to the power supply a second electrode and a control electrode connected to the second electrode;
      a fourth MOS transistor having a first electrode connected to ground, a second electrode connected to the second electrode of the third transistor and a control electrode driven by the input means, wherein equal currents pass through the third and fourth transistors at a level determined by the control current;
      a first capacitor having a terminal connected to the control terminal of the third transistor and storing a charge; a second capacitor having a terminal connected to the control terminal of the fourth transistor and storing a charge; and first switching means for alternately connecting (a) the control terminal of the first transistor to the control terminal of the third transistor to cause current proportional to the control current to flow through the first transistor to the output terminal, and (b) the control terminal of the second transistor to the control terminal of the fourth transistor to cause current proportional to the control current to flow through the second transistor from the output terminal;
   a reference capacitor having one terminal connected to the output terminal and another terminal connected to ground, wherein the reference capacitor is alternately charged by the first transistor and discharged by the second transistor;
   reference voltage means for providing a first reference voltage and a second reference voltage smaller than the first reference voltage;
   comparison means having a first input connected to the output terminal and a second input connected to the reference voltage means; and
   second switching means for connecting the first or second reference voltage to the comparison means wherein said first and second switching means are controlled by the output of the comparison means so that the reference capacitor is sequentially charge up to the first reference voltage and then discharged to the second reference voltage wherein the rate of charging and discharging is controlled by the control current, wherein the ouput of the comparison means is the output of the oscillator.

12. A voltage controlled oscillator, comprising:

a power supply;

a voltage-to-current converter for receiving a control voltage and converting it to a corresponding control current at a first node;

a bias resistor connected between the power supply and the first node, wherein a bias current flows through the bias resistor and is summed with the control current to provide a reference current at the first node;

a reference N-type MOS transistor having its drain connected to the first node, its source connected to ground and its gate and drain interconnected, wherein the reference current flows through the reference transistor;

an N-type MOS second transistor having its source connected to ground and its gate connected to the gate of the reference transistor, wherein a current proportional to the reference current will flow through the second transistor;

a P-type MOS third transistor having its source connected to the power supply, its drain connected to the drain of the second transistor and its gate and drain interconnected, wherein current flowing through the third transistor will equal the current flowing through the second transistor;

a first MOS capacitor having a first terminal connected to the gate of the second transistor and a second terminal connected to one of the power supply and ground;

a second MOS capacitor having a first terminal connected to the gate of the third transistor and a second terminal connected to one of the power supply and ground;

a first MOS switch means having a first terminal connected to the gate of the second transistor and having a second terminal;

a second MOS switch means having a first terminal connected to the gate of the third transistor and having a second terminal;

an N-type MOS fourth transistor having its source connected to ground and its gate connected to the second terminal of the first switch means;

a third MOS switch means having a first terminal connected to the gate of the fourth transistor and a second terminal connected to ground;

a P-type MOS fifth transistor having its source connected to the power supply and its gate connected to the second terminal of the second switch means, wherein the drain of the fifth transistor is connected to the drain of the fourth transistor at a pump node;

a fourth MOS switch means having one terminal connected to the gate of the fifth transistor and a second terminal connected to the power supply;

a reference capacitor having one terminal connected to ground and another terminal connected to the pump node;

a comparator having a first input connected to the pump node and a second input;

reference voltage means for providing a first reference voltage and a second reference voltage which is lower than the first reference voltage;

a fifth MOS switch means for selectively applying the first reference voltage to the second input of the comparator;

a sixth MOS switch means for selectively applying the second reference voltage to the second input of the comparator;

wherein said switch means are controlled in accordance with the output state of the comparator wherein during a first time period the first, fourth and sixth switch means are open and the second, third and fifth switch means are closed, whereby the fifth transistor is rapidly turned on to a current level proportional to the current through the third transistor thereby charging the reference capacitor until the voltage across it is equal to the first reference voltage, and wherein during a second time period each of the switch means is switched to turn off the fifth transistor and turn on the fourth transistor to a current level proportional to the current through the second transistor to discharge the reference capacitor until the voltage across it equals the second reference voltage, at which point the switches are again switched, wherein the output of the comparator changes states at a frequency corresponding to the value of the control voltage.

13. A voltage controlled oscillator as in claim 12 wherein the bias resistor and reference capacitor are external components and the remaining components are on a monolithic integrated circuit.

14. A voltage controlled oscillator as in claim 12 wherein the switch means are transmission gates.

* * * * *